(12) United States Patent
Azidehak et al.

(10) Patent No.: US 11,592,485 B2
(45) Date of Patent: Feb. 28, 2023

(54) METHODS AND APPARATUS FOR CONTACTOR WELD DETECTION IN A VEHICLE

(71) Applicant: Farasis Energy (Ganzhou) Co., Ltd., Ganzhou (CN)

(72) Inventors: Ali Azidehak, Hayward, CA (US); Tuan Truong, Hayward, CA (US); Ben Johnson, Hayward, CA (US)

(73) Assignee: FARASIS ENERGY (GANZHOU) CO., LTD., Ganzhou (CN)

( * ) Notice: Subject to any disclaimer, the term of this patent is extended or adjusted under 35 U.S.C. 154(b) by 232 days.

(21) Appl. No.: 17/061,969

(22) Filed: Oct. 2, 2020

(65) Prior Publication Data

US 2021/0102998 A1 Apr. 8, 2021

Related U.S. Application Data

(60) Provisional application No. 62/911,136, filed on Oct. 4, 2019.

(51) Int. Cl.
*G01R 31/327* (2006.01)
*G01R 31/364* (2019.01)
*B60R 16/02* (2006.01)

(52) U.S. Cl.
CPC ......... *G01R 31/3277* (2013.01); *B60R 16/02* (2013.01); *G01R 31/364* (2019.01)

(58) Field of Classification Search
None
See application file for complete search history.

(56) References Cited

U.S. PATENT DOCUMENTS

| | | | |
|---|---|---|---|
| 2006/0021098 A1* | 1/2006 | Tezuka | H01H 47/002 477/7 |
| 2016/0282420 A1* | 9/2016 | Baraszu | G05D 1/0055 |
| 2018/0105059 A1* | 4/2018 | Namou | G01R 31/3271 |

* cited by examiner

*Primary Examiner* — Jared Fureman
*Assistant Examiner* — Joel Barnett
(74) *Attorney, Agent, or Firm* — Volpe Koenig

(57) ABSTRACT

The proposed mechanism for weld detection, uses isolation monitoring circuits (which is used for measurement of the leakage current between battery positive and negative to the chassis ground (on pack or link side) and checks the health status of the contactors. The mechanism connects isolation monitoring circuit between two points on the battery pack (between two sides of the high current contactors) and measures the resistance of two points, therefore checking the continuity of the contactors in the system. Since it can measure a range of resistance, it can also check if a contactor is completely welded or it has been partially welded. This would be important because in case of partial weld, the car can fix the problem and remove the partial weld by activating and deactivating the contactors for several time, with or without inserting high current in the coil of the contactors. Since the proposed mechanism is using available measurement circuits of the isolation monitoring unit and these circuits are designed with high reliability (which is required for the electrical vehicles), the proposed mechanism is going to lower the cost of the entire vehicle while keeping the passenger safe.

19 Claims, 17 Drawing Sheets

| | | 1 | 2 | 3 | 4 | 5 | 6 | 7 | 8 |
|---|---|---|---|---|---|---|---|---|---|
| | Notes | | | time required for discharging the capacitors, more than 1s is needed | time required for discharging the capacitors, more than 1s is needed | Very large time required for discharging capacitors (50s in the simulation) | | Very large time required for discharging capacitors (50s in the simulation) | |
| Isolation measurement | Isolation active voltage source (V) | 12 | 12 | 12 | 12 | 12 | 12 | 12 | 12 |
| | Isolation series resistor (Ohm) | 1000000 | 1000000 | 1000000 | 1000000 | 1000000 | 1000000 | 1000000 | 1000000 |
| | Isolation measurement resistor (Ohm) | 200 | 200 | 200 | 200 | 200 | 200 | 200 | 200 |
| | Isolation measurement voltage (uV) [low side switch on] | 0 | 0 | -2400 | -2400 | ####### | 72000 | -2400 | 22400 |
| | Isolation measurement voltage (uV) [high side switch on] | 0 | 0 | ####### | -76400 | -2400 | -2400 | -2400 | -27000 |
| | Isolation measurement current (uA) [low side switch on] | 0 | 0 | -12 | -12 | 360 to 0 in 50s | 360 | -12 | 112 |
| | Isolation measurement current (uA) [high side switch on] | 0 | 0 | it goes from -577 to 0 in 50s | -382 | -12 | -12 | -12 | -135 |
| Pack measurement | Shunt measurement current (A) [low side switch on] | 0 | 0 | 0 | 0 | 0 | 0 | 0 | high current |
| | Shunt measurement current (A) [high side switch on] | 4E-07 | 4E-07 | 0 | 0 | 0 | 0 | high current | high current |
| | Link Voltage (V) | 2 | 0 | 1.8 | 0 | 0 to 370 in 50s | 0 | 370 | lower than 370 |
| | Pack Voltage (V) | 370 | 370 | 370 | 370 | 370 | 370 | 370 | 370 |
| Contactors status | Load resistance (Ohm) | 1G | 1 | 1G | 1 | 1G | 1 | 1G | 1 |
| | HV- contactor resistance (Ohm) | 1G | 1G | 1 | 1 | 1G | 1G | 1 | 1 |
| | HV+ contactor resistance (Ohm) | 1G | 1G | 1G | 1G | 1 | 1 | 1 | 1 |
| | Description of Test conditions | Both contactors are open, no load | Both contactors are open, 1 ohm load | only negative contactor is closed, no load | only negative contactor is closed, 1 ohm load | only positive contactor is closed, no load | only positive contactor is closed, 1 ohm load | both contactor are closed, no load | both contactor are closed, 1 ohm load |

Fig. 13

METHODS AND APPARATUS FOR CONTACTOR WELD DETECTION IN A VEHICLE

CROSS REFERENCE TO RELATED APPLICATIONS

This application claims priority to U.S. provisional application No. 62/911,136, filed on Oct. 4, 2019, entitled "Methods for contactor weld detection in electric vehicles", which is specifically and entirely incorporated by reference.

FIELD OF THE INVENTION

The present disclosure relates to contactor weld detection in vehicles, particularly to methods and apparatus for contactor weld detection in a vehicle.

BACKGROUND OF THE INVENTION

Generally, a vehicle (e.g. an electrical vehicle or hybrid-electric vehicle) may be equipped with a battery pack. There may be two high current contactors (main contactors) and one auxiliary contactor (pre-charge contactor) in the battery pack. The main contactors may be responsible for delivering large amount of power to a link side connecting a load, e.g., a traction unit of the vehicle, in order to power the vehicle, e.g., move the vehicle, for example. The auxiliary contactor may be responsible for regulating the voltage of a link capacitor in the link side before turning on the main contactors. During the operation of the main contactors in the electric vehicle, there may be a chance that metallic parts in the mechanical contactor (e.g., main contactor) get welded together, completely or partially. There may be different causes for weld in the contactors. One of the main reasons may be conducting high current through contactors and due to heat or physical effect like Lorentz force, an arc might happen between the metallic parts, which welds the metallic parts together.

Having welded contactors in the vehicles is a hazard to the passengers and the repair technicians. In case of repair, the link side would be connected to the battery and the service person would get shocked if he/she touches the energized link side and make a complete circuit. Therefore, a mechanism for contactor weld detection with high reliability is still needed.

SUMMARY OF THE INVENTION

This section provides a general summary of the disclosure, and is not a comprehensive disclosure of its full scope or all of its features.

A general object of the present disclosure is to provide methods and apparatus for contactor weld detection in a vehicle, e.g., electric vehicle or hybrid-electric vehicle, which methods and apparatus provide improved performance in terms of high accuracy of contactor weld detection, high isolation fault tolerance, during operation of contactor weld detection.

According to a first aspect of the present disclosure, a method for contactor weld detection in a vehicle is provided, wherein the vehicle comprises a battery system, the battery system comprises a battery pack side, a link side, a first contactor and a second contactor, the first contactor is configured to connect a positive electrode terminal of the battery pack side and a positive terminal of the link side, the second contactor is configured to connect a negative electrode terminal of the battery pack side and a negative terminal of the link side, wherein, the battery system further comprises a contactor weld detection circuit including a first circuit and a second circuit, the first circuit comprises a first leg including a first switch and a first resistor in series connection with each other and a second leg including a second switch and a second resistor in series connection with each other, one end of the first leg is connected with the positive electrode terminal of the battery pack side, one end of the second leg is connected with the negative electrode terminal of the battery pack side, the other ends of the first and second legs are connected together and to a chassis of the vehicle, the second circuit comprises a third leg including a third switch and a third resistor in series connection with each other, a fourth leg including a fourth switch and a fourth resistor in series connection with each other, and a power source, one end of the third leg is connected with the positive terminal of the link side, one end of the fourth leg is connected with the negative terminal of the link side, the other ends of the first and second legs are connected together and to a positive terminal of the power source, a negative terminal of the power source is operably connected with the chassis, wherein, the method comprising:
ensuring the first and second contactors are set in an open state;
operating the contactor weld detection circuit to enable an electrical path around a contactor of the first and second contactors to be detected;
measuring a current that flows through the electrical path; and
determining a health status of the contactor based at least on the measured current.

In an example embodiment, the step of operating the contactor weld detection circuit to enable an electrical path around a contactor of the first and second contactors to be detected comprising:
turning on one of the first and second switches and one of the third and fourth switches associated with the contactor to be detected, in order to enable the electrical path around the contactor.

In an example embodiment, the step of determining a health status of the contactor based at least on the measured current comprising:
determining whether the contactor is welded based at least on the measured current.

In an example embodiment, the step of determining a health status of the contactor based at least on the measured current further comprising:
determining a resistance of the contactor based at least on the measured current, on a condition that the contactor is determined to be welded; and
determining a type of the contactor weld based on the determined resistance.

In an example embodiment, the type of the contactor weld comprises a partial weld or a complete weld.

In an example embodiment, the first circuit further comprises:
a first bypass switch in parallel connection with the first resistor; and
a second bypass switch in parallel connection with the second resistor;

wherein the method further comprising:

turning on one of the first and second bypass switches in order to bypass one of the first and second resistors in the electrical path.

In an example embodiment, the contactor weld detection circuit further comprises:

a switching device including a common terminal, a first terminal, a second terminal and a third terminal, wherein, the common terminal is electrically connected with the negative terminal of the power source, the first terminal is electrically connected with one end of the second contactor electrically connected with the negative electrode terminal of the battery pack side, the second terminal is electrically connected with one end of the first contactor electrically connected with the positive electrode terminal of the battery pack side, and the third terminal is electrically connected with the chassis, the switching device is configured to electrically connect the common terminal and the first terminal when in a first operational state, electrically connect the common terminal and the second terminal when in a second operational state, and electrically connect the common terminal and the third terminal when in a third operational state, wherein, the step of operating the contactor weld detection circuit to enable an electrical path around a contactor of the first and second contactors to be detected comprising:

turning on one of the third and fourth switches associated with the contactor to be detected, and operating the switching device to electrically connect the common terminal and one of the first, second and third terminals in electrical connection with the contactor, in order to enable the electrical path around the contactor.

In an example embodiment, the step of determining a health status of the contactor based at least on the measured current comprising:

comparing the measured current with a look-up table;

determining a type of failure in the contactors based on the comparison result.

In an example embodiment, the switching device comprises a tri-state switch.

According to a second aspect of the present disclosure, an apparatus for contactor weld detection in a vehicle is provided, wherein the vehicle comprises a battery system, the battery system comprises a battery pack side, a link side, a first contactor and a second contactor, the first contactor is configured to connect a positive electrode terminal of the battery pack side and a positive terminal of the link side, the second contactor is configured to connect a negative electrode terminal of the battery pack side and a negative terminal of the link side, wherein, the apparatus comprising:

a contactor weld detection circuit including a first circuit and a second circuit, wherein the first circuit comprises a first leg including a first switch and a first resistor in series connection with each other and a second leg including a second switch and a second resistor in series connection with each other, one end of the first leg is connected with the positive electrode terminal of the battery pack side, one end of the second leg is connected with the negative electrode terminal of the battery pack side, the other ends of the first and second legs are connected together and to a chassis of the vehicle, the second circuit comprises a third leg including a third switch and a third resistor in series connection with each other, a fourth leg including a fourth switch and a fourth resistor in series connection with each other, and a power source, one end of the third leg is connected with the positive terminal of the link side, one end of the fourth leg is connected with the negative terminal of the link side, the other ends of the third and fourth legs are connected together and to a positive terminal of the power source, a negative terminal of the power source is operably connected with the chassis;

a sensor configured to measure a current that flows through the power source; and a controller configured to:

ensure the first and second contactors are set in an open state;

operating the contactor weld detection circuit to enable an electrical path around a contactor of the first and second contactors to be detected;

receive, from the sensor, the measured current that flows through the electrical path; and determine a health status of the contactor based at least on the measured current.

In an example embodiment, the controller is configured to:

turn on one of the first and second switches and one of the third and fourth switches associated with the contactor to be detected, in order to enable the electrical path around the contactor.

In an example embodiment, the controller is configured to:

determine whether the contactor is welded based at least on the measured current.

In an example embodiment, the controller is further configured to:

determine a resistance of the contactor based at least on the measured current, on a condition that the contactor is determined to be welded; and determine a type of the contactor weld based on the determined resistance.

In an example embodiment, the type of the contactor weld comprises a partial weld or a complete weld.

In an example embodiment, the first circuit further comprises:

a first bypass switch in parallel connection with the first resistor; and a second bypass switch in parallel connection with the second resistor;

wherein the controller is further configured to:

turn on one of the first and second bypass switches in order to bypass one of the first and second resistors in the electrical path.

In an example embodiment, the contactor weld detection circuit further comprises:

a switching device including a common terminal, a first terminal, a second terminal and a third terminal, wherein, the common terminal is electrically connected with the negative terminal of the power source, the first terminal is electrically connected with one end of the second contactor electrically connected with the negative electrode terminal of the battery pack side, the second terminal is electrically connected with one end of the first contactor electrically connected with the positive electrode terminal of the battery pack side, and the third terminal is electrically connected with the chassis, the switching device is configured to electrically connect the common terminal and the first terminal when in a first operational state, electrically connect the common terminal and the second terminal when in a second operational state, and electrically connect the common terminal and the third terminal when in a third operational state, wherein, the controller is configured to:

turn on one of the third and fourth switches associated with the contactor to be detected, and operate the switching device to electrically connect the common terminal and one of the first, second and third terminals in electrical connection with the contactor, in order to enable the electrical path around the contactor.

In an example embodiment, the controller is configured to:

comparing the measured current with a look-up table;

determining a type of failure in the contactors based on the comparison result.

In an example embodiment, the switching device comprises a tri-state switch.

According to a third aspect of the present disclosure, a vehicle is provided, comprising:

a battery pack side;

a link side;

a first contactor and a second contactor, wherein the first contactor is configured to connect a positive electrode terminal of the battery pack side and a positive terminal of the link side, the second contactor is configured to connect a negative electrode terminal of the battery pack side and a negative terminal of the link side; and the apparatus according to the second aspect of the disclosure.

Further features of, and advantages with, the present disclosure will be apparent when studying the appended claims and the following description, the person of ordinary skill in the art will realize that different features of the present disclosure may be combined to create embodiments other than those described in the following, without departing from the scope of the present disclosure.

BRIEF DESCRIPTION OF DRAWINGS

A more detailed understanding may be had from the following description, given by way of example in conjunction with the accompanying drawings, wherein like reference numerals in the figures indicate like elements, and wherein:

FIG. 13 shows a table illustrating simulation result for both diagnosis cases of FIGS. 11 and 12, by using the method of FIG. 9.

DETAILED DESCRIPTION OF THE EMBODIMENTS

The present disclosure will now be described more fully hereinafter with reference to the accompanying drawings, in which exemplary embodiments of the disclosure are shown. The disclosure may, however, be embodied in many different forms and should not be construed as limited to the embodiments set forth herein; rather, these embodiments are provided for thoroughness and completeness. Like reference numbers refer to like elements throughout the description. The drawings are not necessarily to scale and certain features may be exaggerated in order to better illustrate and explain the exemplary embodiments of the disclosure.

The embodiments of the present disclosure generally provide for a plurality of circuits or other electrical devices. All references to the circuits and other electrical devices and the functionality provided by each are not intended to be limited to encompassing only what is illustrated and described herein. While particular labels may be assigned to various circuits or other electrical devices disclosed, such labels are not intended to limit the scope of operation for the circuits and the other electrical devices. Such circuits and other electrical devices may be combined with each other and/or separated in any manner based on the particular type of electrical implementation that is desired.

Figure 1:
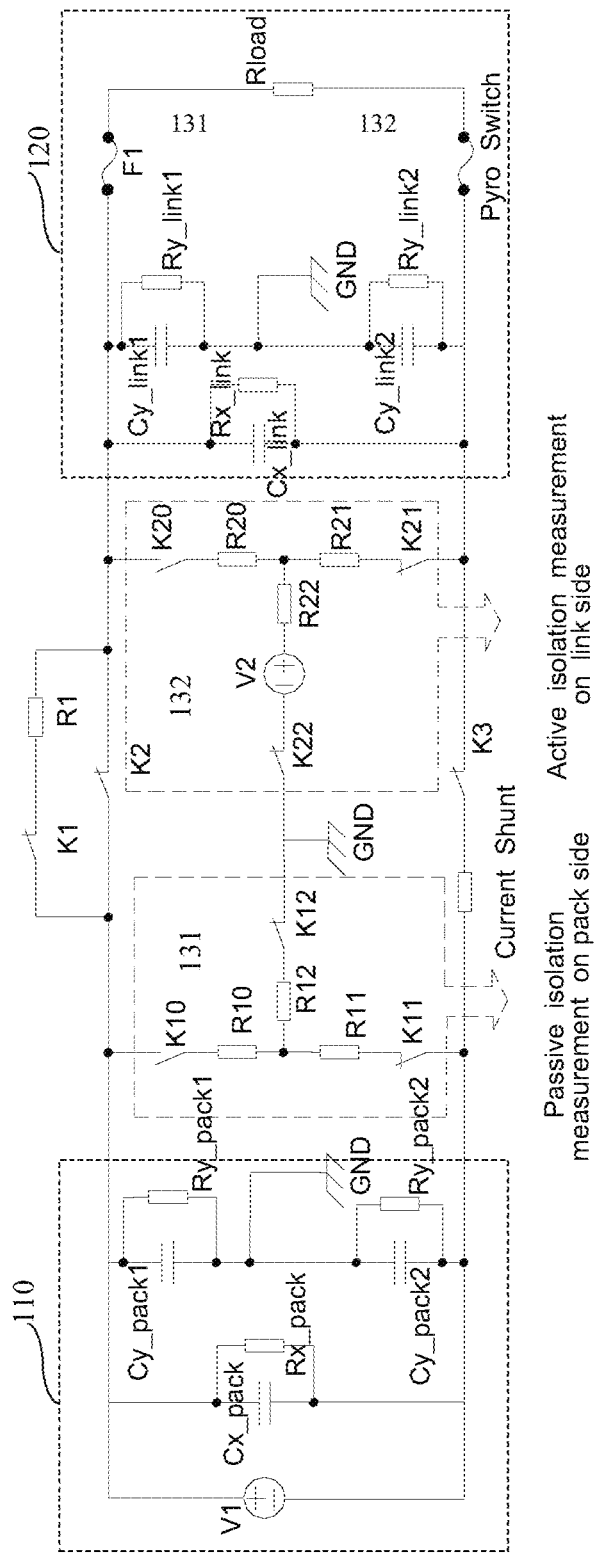
FIG. 1 is a schematic circuit diagram illustrating a conventional circuitry of the battery pack including isolation monitoring.

FIG. 1 is a schematic circuit diagram illustrating a conventional circuitry of the battery pack including isolation monitoring. Referring now to FIG. 1, in each electrical vehicle, there may be two high current contactors (main contactors) and one auxiliary contactor (pre-charge contactor) in a battery pack. The main contactors may be responsible for delivering large amount of power to a link side connecting a load, e.g., a traction unit of the vehicle, in order to power the vehicle, e.g., move the vehicle, for example. The auxiliary contactor may be responsible for regulating the voltage of a link capacitor in the link side before turning on the main contactors. During the operation of the main contactors in the electric vehicles, there may be a chance that metallic parts in the mechanical contactor (e.g., main contactor) get welded together, completely or partially. There may be different causes for weld in the contactors, but one of the main reasons may be conducting high current through contactors and due to heat or physical effect like Lorentz force, an arc might happen between the metallic parts, which welds the metallic parts together.

Having welded contactors in the circuitry of the battery pack (hereinafter, interchangeably used with the battery system, or system) is hazardous to passengers and repair technicians. In case of repair, the link side would be connected to the battery and the service person would get shocked if he/she touches the energized link side and make a complete circuit. In the event of an accident, there may be a chance that link side high voltage bus-bars short together and due to high current, the contactors get welded. Welded contactors must be diagnosed, and an action must be taken into effect (like activation of pyro switch) to disconnect the link side from the battery pack side.

The circuitry of the battery pack may comprise a battery pack side 110, a link side 120 and contactors (K2, K3). The battery pack side 110 may comprise a battery pack provided with a plurality of battery cells, which may be arranged in some type of form. The battery pack side 110 may comprise a positive electrode terminal and a negative electrode terminal (e.g., tabs, bus bars, bus rails, etc.). The link side 120 may comprise a positive terminal and a negative terminal (e.g., tabs, bus bars, bus rails, etc.) configured to receive electrical power from the battery pack side 110 via the contactors (K2, K3). The link side 120 may also comprise an Electromagnetic Interference (EMI) filter unit having a first and second capacitors (Cy_link1, Cy_link2), which may be electrically connected in series across the positive terminal and the negative terminal. A common junction of the first and second capacitors (Cy_link1, Cy_link2) may be connected to a ground (GND), e.g., a chassis of the vehicle. The EMI filter unit may also comprise a third capacitor (Cx_link) connected across the positive and negative terminals, and configured for suppressing Differential Mode (DM) noise in the positive and negative terminals with respect to the ground. The link side 120 may be configured to provide electrical power to a load (Rload), e.g., a traction unit of the vehicle. The contactors may comprise a first contactor K2 and a second contactor K3. The first contactor K2 (hereinafter, also referred as to high-side contactor, positive contactor) may be configured to electrically connect the positive electrode terminal of the battery pack side 110 and the positive terminal of the link side 120. Specifically, the first contactor K2 may comprise a first end and a second end (e.g., first and second pins). The first end may be electrically connected with the positive electrode terminal of the battery pack side 110, and the second end may be electrically connected with the positive terminal of the link side 120. The second contactor K3 (hereinafter, also referred as to low-side contactor, negative contactor) may be configured to electrically connect the negative electrode terminal of the battery pack side 110 and the negative terminal of the link side 120. Specifically, the second contactor K3 may comprise a third end and a fourth end (e.g., third and fourth pins). The third end may be electrically connected with the negative electrode terminal of the battery pack side 110, and the fourth end may be electrically connected with the negative terminal of the link side 120. Both of the first and second contactors (K2, K3) may be configured to switch on or off in order to electrically connect or disconnect the link side 120 to or from the battery pack side 110. Optionally, the second contactor K3 may be in electrical connection in series with a current shunt.

The circuitry may further comprise an isolation monitoring unit. The isolation monitoring unit may comprise a first isolation measurement portion 131 on the battery pack side 110 and a second isolation measurement portion 132 on the link side 120. The first isolation measurement portion 131 may comprise a first leg and a second leg. The first leg may comprise a switch K10 and a resistor R10 in series connection with each other. The second leg may comprise a switch K11 and a resistor R11 in series connection with each other. One end of the first leg may be electrically connected with the positive electrode terminal of the battery pack side 110, and one end of the second leg may be electrically connected with the negative electrode terminal of the battery pack side 110. The other ends of the first and second legs may be electrically connected together and to the ground, e.g., the chassis of the vehicle, via a resistor R12 and optionally a switch K12, for example. The second isolation measurement portion 132 may comprise a power source V2, a third leg and a fourth leg. The third leg may comprise a switch K20 and a resistor R20 in series connection with each other. The fourth leg may comprise a switch K21 and a resistor R21 in series connection with each other. One end of the third leg may be electrically connected with the positive terminal of the link side 120, and one end of the fourth leg may be electrically connected with the negative terminal of the link side 120. The other ends of the third and fourth legs may be electrically connected together and to the positive terminal of the power source V2, e.g., via a resistor R22. The negative terminal of the power source may be electrically connected with the ground, e.g., the chassis of the vehicle, via a switch K22, for example. The functionality and operation of the isolation monitoring unit will be described below in detail.

In electrical vehicles, positive and negative electrode terminals (e.g., positive and negative tabs,) of the battery pack (side) may be checked for any electrical leakage to the ground, e.g., the chassis. This checking may be done before turning the main contactors on. Since there may be no voltage on the link side before turning the contactors on, isolation measurement should have some type of internal voltage/current source to use and measure the electrical leakage. By applying a voltage (V2) (e.g., a power source) and measuring the current that is passing through the power source (e.g., equivalent to the voltage on R22 divided by its resistance), it is possible to calculate the equivalent resistance in parallel to the power source. By finding the equivalent resistance and knowing the series resistance of the isolation monitoring (R22 plus R20), it is possible to find the external resistance. In order to find the position of leakage (e.g. Ry_link1 and Ry_link2), switches K20 and K21 may be turned on sequentially and equivalent resistance is measured. By solving 2 sets of equations, it is possible to find each leakage resistance. This mechanism is known as active isolation monitoring.

In the battery pack side, isolation monitoring is depended on voltage of the battery. It uses the battery as voltage source to find leakage current between battery positive or negative to the chassis ground. By switching switches K10 and K11 and solving 2 sets of equations, it is possible to find individual leakage resistance between each battery tab to the chassis. This mechanism is known as passive isolation monitoring.

Figure 2:
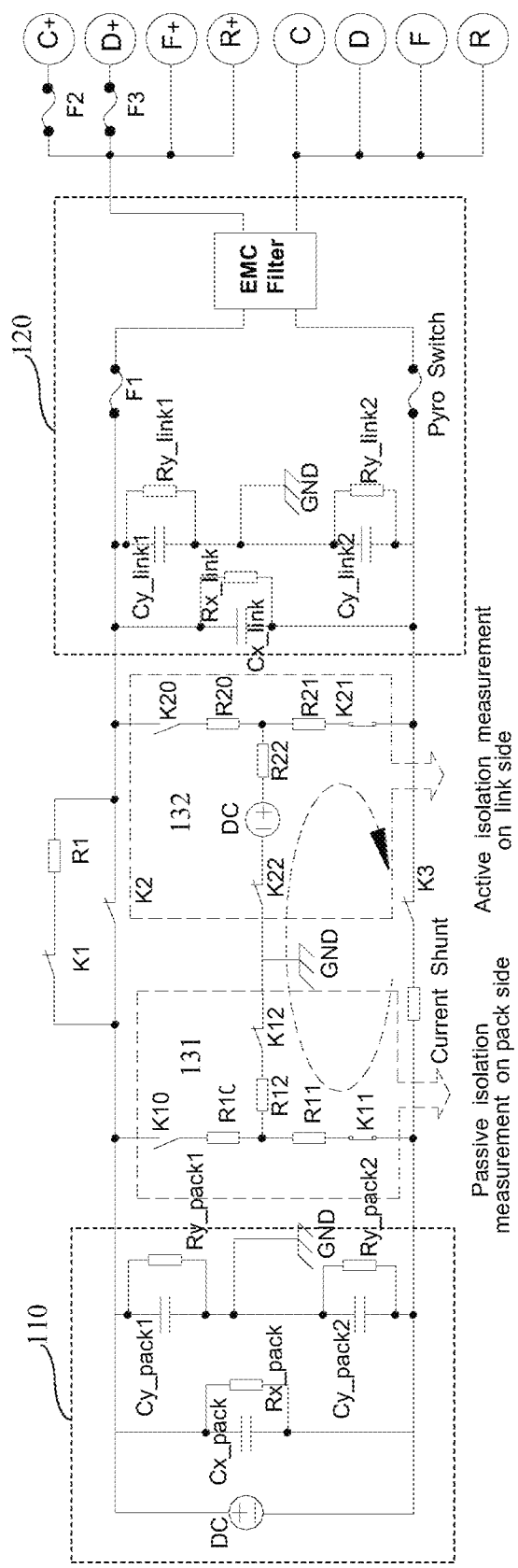
FIG. 2 is a schematic circuit diagram illustrating an example circuitry of the battery pack including isolation monitoring, in which an example method for contactor weld detection may be implemented according to an example embodiment of the disclosure.
Figure 3:
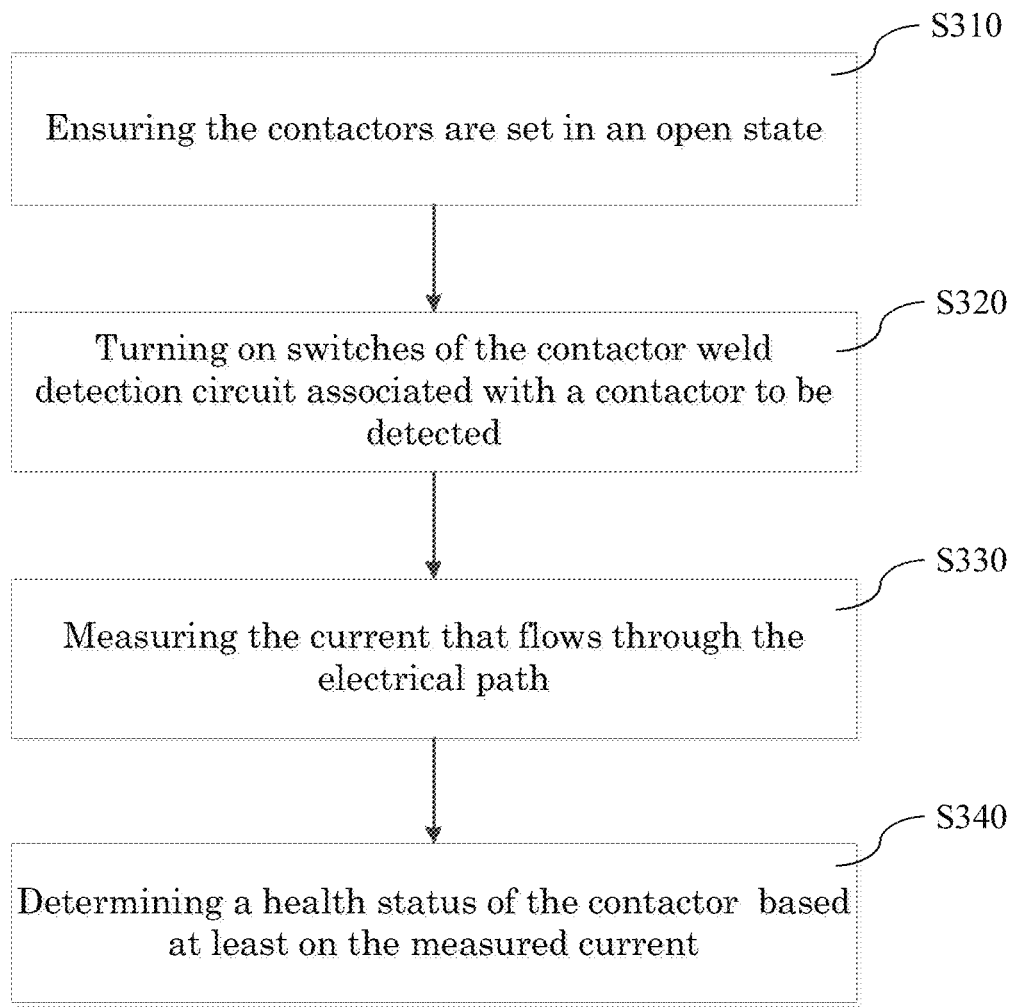
FIG. 3 is a flow chart illustrating the example method for contactor weld detection according to an example embodiment of the disclosure.

FIG. 2 is a schematic circuit diagram illustrating an example circuitry of the battery pack including isolation monitoring, in which an example method for contactor weld detection may be implemented according to an example embodiment of the disclosure. The circuitry in FIG. 2 is similar to that in FIG. 1. Therefore, like elements may use like reference numbers or labels. In the embodiment of FIG. 2, a contactor weld detection circuit may be used, which may comprise or use aforesaid isolation monitoring unit. The power source may be a voltage source. FIG. 3 is a flow chart illustrating the example method for contactor weld detection according to an example embodiment of the disclosure. The method may be used in vehicles, such as electric vehicles, hybrid-electric vehicles, for example. Referring to FIG. 3, the method may comprise following steps.

At S310, contactors may be set in an open state. Specifically, the contactors (i.e., the first and second contactors) may be ensured that the contactors may be set in an open state before the operation of contactor weld detection. At S320, switches of the contactor weld detection circuit associated with a contactor to be detected (i.e., one of the first and second contactors) may be turned on (i.e., switched on). For example, in case of the second contactor being detected, switches K11 and K21 may be turned on (and switches K12 and K22 may be turned on, if any), in order to make a electrical path around the second contactor K3 (e.g., as indicated by a circular arrow in FIG. 2). At S330, the current that flows through the electrical path (equivalent to the current passing through the power source (e.g., voltage source) may be measured. There may be various ways to measure the current. In an example, a current sensor may be used to measure the current, such as, e.g., Hall sensor. In another example, a voltage sensor may be used to measure a voltage across a resistor of which the resistance may be known (e.g., R22 in FIG. 2). By dividing the measured voltage by the resistance, the current may be measured. At S340, a health status of the contactor may be determined based at least on the measured current. Specifically, it may be determined that whether contactor weld may happen, and if happened the weld may be a partial weld (i.e., the contactor may be partially welded) or a complete weld (i.e., the contactor may be completely welded), based on the measured current. By dividing the voltage of the power source (which may be known) by the current, it may be possible to measure the total current and therefore, the resistance of the contactor. The type of weld (i.e., the partial weld or the complete weld) may be detected based on the resistance of the contactor, since the resistance of the contactor while the contactor may be partially welded may distinguishable from that while being completely welded.

The mechanism of the example embodiments with reference to FIGS. 2 and 3 may use the passive and active isolation monitoring and make a path around the contactors. An advantage of this method of the embodiments may be based on the previously designed isolation monitoring; therefore no things extra may be needed. It can test the continuity of the high current contactors. For testing of each contactor, the high voltage switches of the same polarity in isolation monitoring must be turned on (e.g. K11 and K21 for the low-side contactor K3) and then the current that is passing through the known voltage source is measured. By dividing the voltage by current, it is possible to measure the total current and therefore, the resistance of the contactor.

Figure 4:
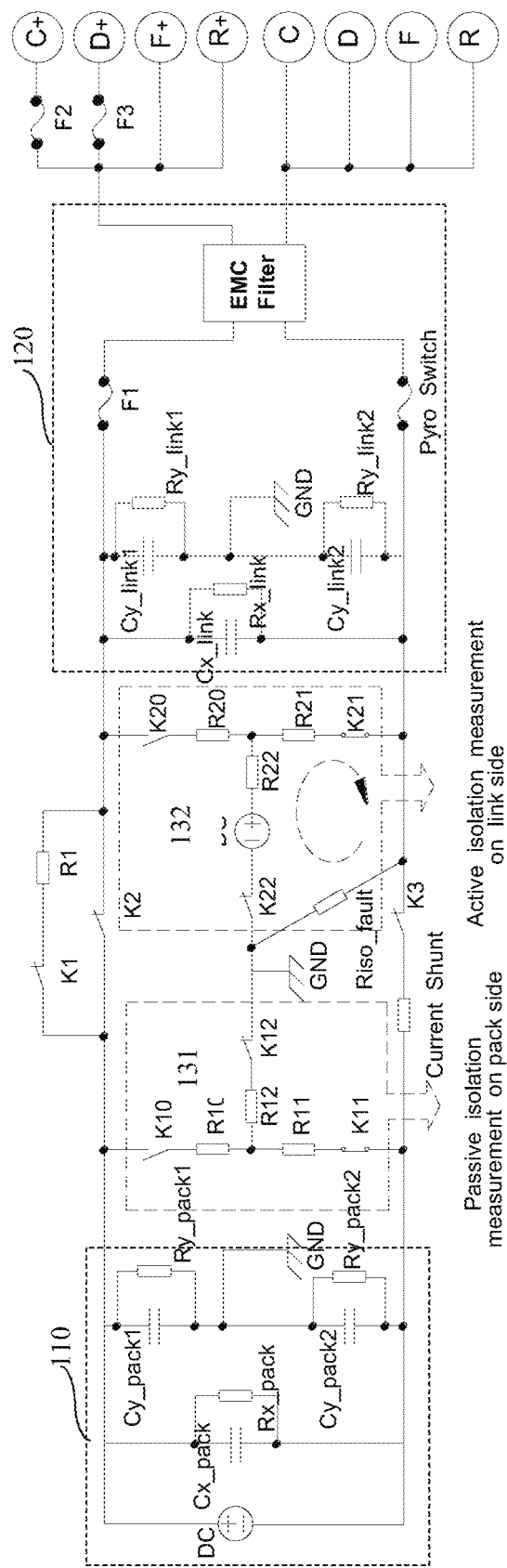
FIG. 4 is a schematic circuit diagram illustrating an example circuitry of the battery pack including isolation monitoring, in which an example method for contactor weld detection of an example embodiment of FIG. 3 may be implemented, in which an isolation fault may happen.

The main disadvantage of the mechanism may be its susceptibility to isolation fault. In case of any isolation fault, there will be a resistance between the chassis ground to the battery (pack) or the link side. This resistance can be detected by the isolation monitoring, but it would degrade the functionality of the contactor weld detection. Referring to FIG. 4, for example, in the fault shown in the figure, the isolation fault (i.e., a resistor (e.g., Riso_fault in FIG. 4) may be formed between the fourth end of the second contactor and the ground, e.g., the chassis) may be causing a path around the contactor (e.g., as indicated by a circular arrow in FIG. 4), which means the isolation monitoring unit cannot measure its resistance and its health. Therefore, this mechanism may not be isolation fault tolerant.

Figure 5:
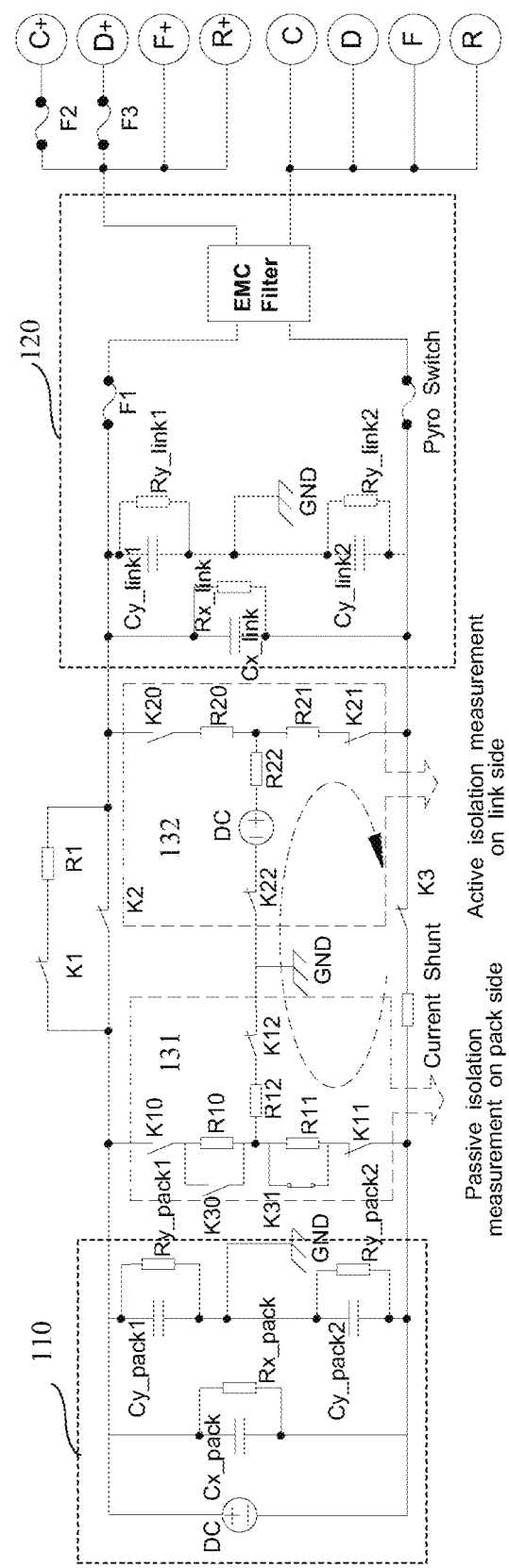
FIG. 5 is a schematic circuit diagram illustrating another example circuitry of the battery pack including isolation monitoring, in which another example method for contactor weld detection may be implemented according to another example embodiment of the disclosure.
Figure 6:
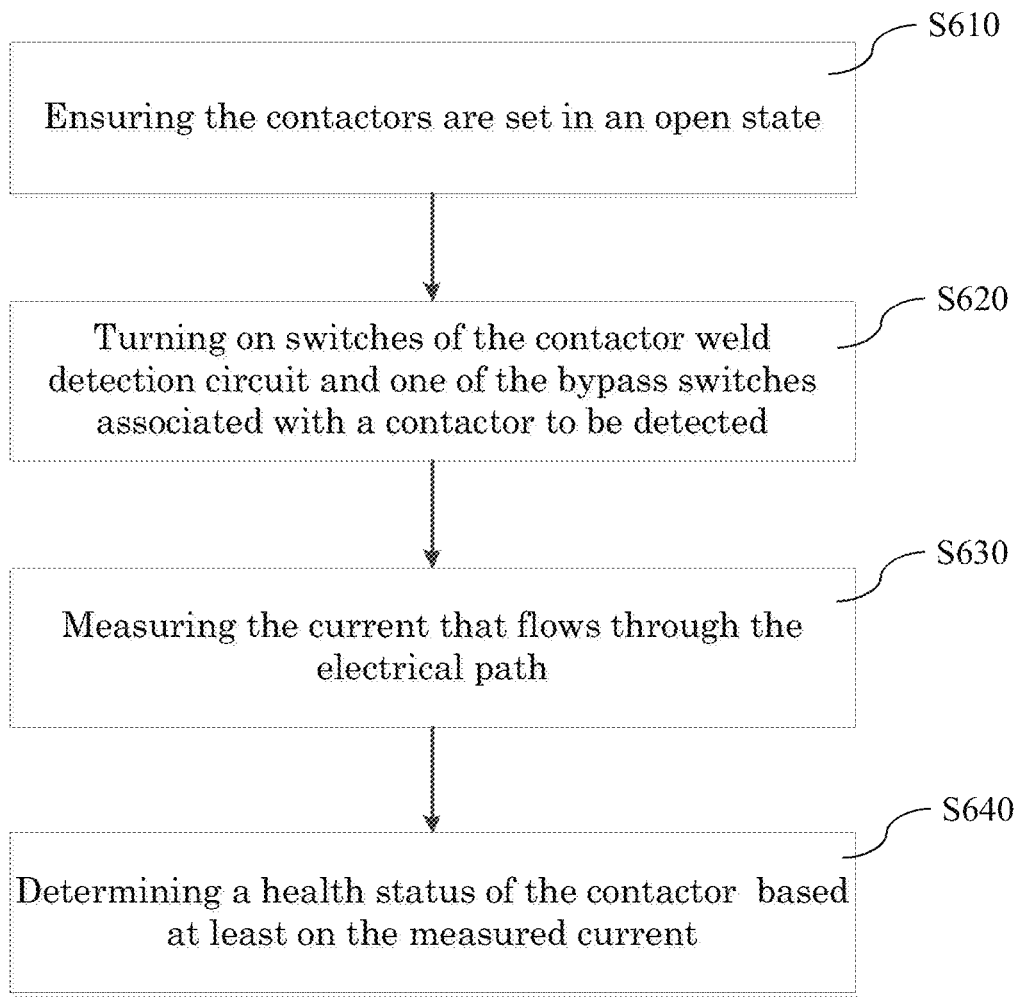
FIG. 6 is a flow chart illustrating another example method for contactor weld detection according to another example embodiment of the disclosure.

Improvements may be made to the example embodiments of FIGS. 2 and 3. FIG. 5 is a schematic circuit diagram illustrating another example circuitry of the battery pack including isolation monitoring, in which another example method for contactor weld detection may be implemented according to another example embodiment of the disclosure. The circuitry in FIG. 5 is primarily similar to that in FIG. 2; Therefore, like elements may use like reference numbers or labels. The difference there between is the contactor weld detection circuit in FIG. 5 may further comprise a first bypass switch K30 and a second bypass switch K31. The first bypass switch K30 may be in parallel connection with the first switch K10, and the second bypass switch K31 may be in parallel connection with the second switch K11. In an example, the first and second bypass switch may be high-voltage switches, such as, e.g., optical driven switches. FIG. 6 is a flow chart illustrating another example method for contactor weld detection according to another example embodiment of the disclosure. The method may be used in vehicles, such as electric vehicles, hybrid-electric vehicles, for example. Referring to FIG. 6, the method may comprise following steps.

At S610, contactors may be set in an open state. Specifically, the contactors (i.e., the first and second contactors (K2, K3) may be ensured that the contactors may be set in an open state before the operation of contactor weld detection. At S620, switches of the contactor weld detection circuit associated with a contactor to be detected (i.e., one of the first and second contactors) may be turned on (i.e., switched on) and one of the bypass switches (i.e., the first and second bypass switches K30, K31) associated with the contactor to be detected may be turned on (i.e., switched on). For example, in case of the second contactor K3 being detected, switches K11 and K21 may be turned on (and switches K12 and K22 may be turned on, if any), in order to make an electrical path around the second contactor K3 (e.g., as indicated by a circular arrow in FIG. 5). Meanwhile, the high voltage resistor (R11) which usually may have large resistance may be eliminated from the electrical path due to the turn-on of the bypass switch K31 (i.e., the resistor R11 may be bypassed). At S630, the current that flows through the electrical path (equivalent to the current passing through the power source (e.g., voltage source DC) may be measured. There may be various ways to measure the current. In an example, a current sensor may be used to measure the current, such as, e.g., Hall sensor. In another example, a voltage sensor may be used to measure a voltage across a resistor of which the resistance may be known (e.g., R22 in FIG. 5). By dividing the measured voltage by the resistance, the current may be measured. At S640, a health status of the contactor may be determined based at least on the measured current. Specifically, it may be determined that whether contactor weld may happen, and if happened the weld may be a partial weld (i.e., the contactor may be partially welded) or a complete weld (i.e., the contactor may be completely welded), based on the measured current. By dividing the voltage of the power source (which may be known) by the current, it may be possible to measure the total current and therefore, the resistance of the contactor. The type of weld (i.e., the partial weld or the complete weld) may be detected based on the resistance of the contactor, since the resistance of the contactor while the contactor may be partially welded may distinguishable from that while being completely welded.

The contactor weld detection circuit in the embodiment of FIG. 5 may add two high-voltage switches (i.e., the first and second bypass switches K30 and K31) in parallel with passive isolation monitor switches. This addition may improve the accuracy of the contactor weld detection circuit, since the close path around the contactor may not go through large resistance of passive isolation monitoring (e.g., R11). The cost of this improvement may be two high voltage switches (e.g. Optical driven switches).

Figure 7:
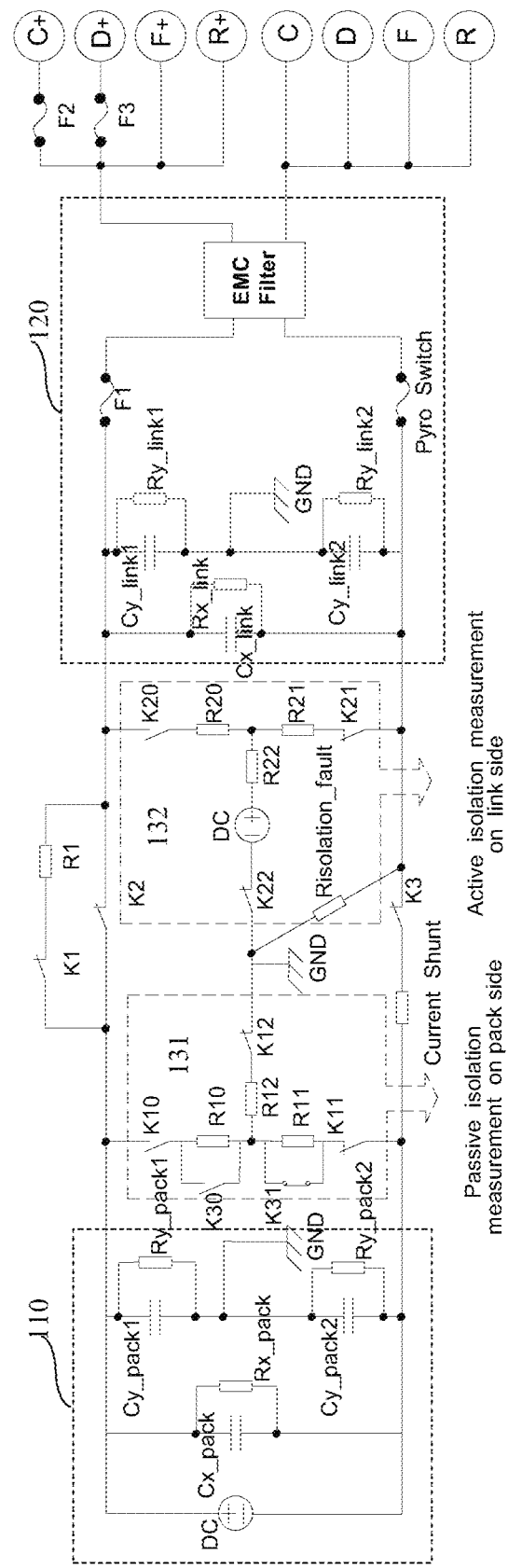
FIG. 7 is a schematic circuit diagram illustrating another example circuitry of the battery pack including isolation monitoring, in which another example method for contactor weld detection of an another example embodiment of FIG. 6 may be implemented, in which an isolation fault may happen.

However, this mechanism may be still susceptible to the isolation faults on the link side. Any isolation fault can change the circuit loop, which in turn would differ the conclusion on the fault in the system. As shown in FIG. 7, the fault in the link side 120 has closed the circuit around the low side contactor K3 which disables the contactor weld detection circuit. The advantage in this system is large isolation resistance on link side 120 cannot affect the contactor weld detection circuit and only very small resistance can affect the result. In this architecture, any isolation fault on the battery pack side 110 has no effect on the contactor weld detection mechanism.

Figure 8:
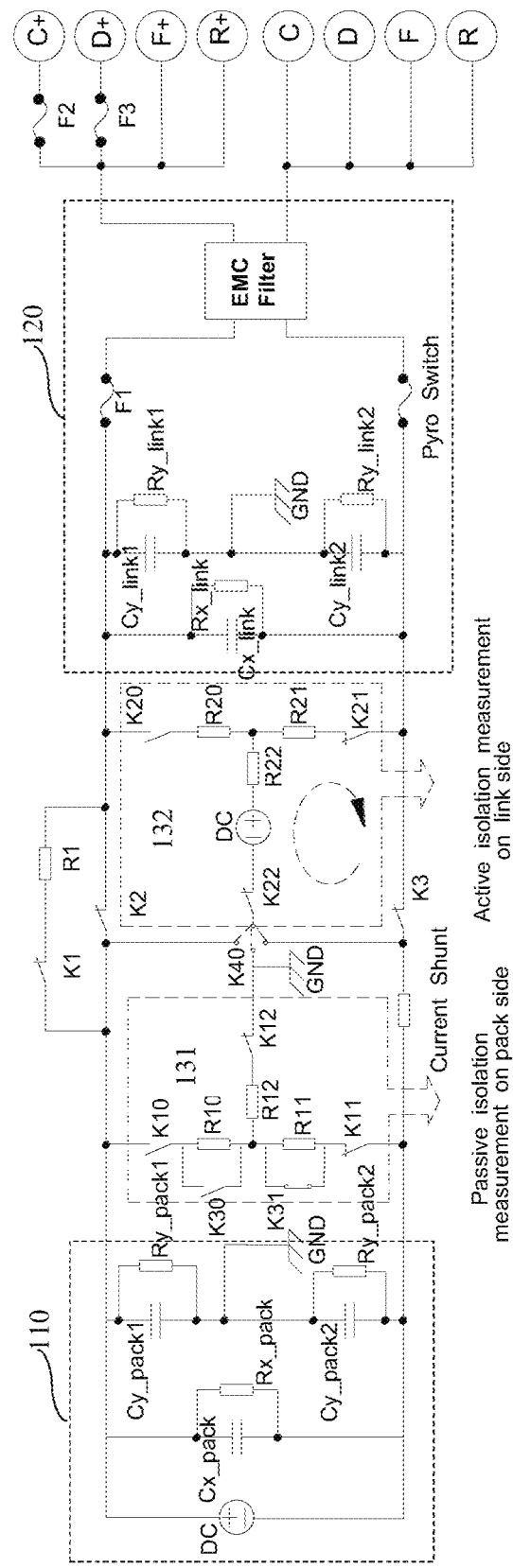
FIG. 8 is a schematic circuit diagram illustrating yet another example circuitry of the battery pack including isolation monitoring, in which yet another example method for contactor weld detection may be implemented according to yet another example embodiment of the disclosure.

The main reason for the susceptibility of the contactor weld detection of aforesaid embodiments may be that the common measuring point may have been connected to the ground, e.g., the chassis. Therefore, any isolation fault (which means resistance between high voltage tabs to chassis) can create a close loop (circuit). The solution for this susceptibility may be separation of active isolation monitor and its connection to a tri-state switch. Therefore, the common point can be connected to the chassis ground (for isolation monitoring) or contactor pins on positive and negative sides of the battery pack. FIG. 8 is a schematic circuit diagram illustrating yet another example circuitry of the battery pack including isolation monitoring, in which yet another example method for contactor weld detection may be implemented according to yet another example embodiment of the disclosure. The circuitry in FIG. 8 is primarily similar to that in FIG. 2; Therefore, like elements may use like reference numbers or labels. The difference therebetween is the contactor weld detection circuit in FIG. 8 may further comprise a switching device K40. The switching device K40 may comprise a first terminal, a second terminal, a third terminal and a common terminal. The common terminal may be connected with the negative terminal of the power source (e.g., the voltage source DC in FIG. 8). The first terminal of the switching device K40 may be connected with the end (i.e., the third end) of the second contactor K3, which may be connected with the negative electrode terminal of the battery pack side 110. The second terminal of the switching device K40 may be connected with the end (i.e., the first end) of the first contactor K2, which may be connected with the positive electrode terminal of the battery pack side 110. The third terminal of the switching device K40 may be connected with the ground, e.g., the chassis. The switching device K40 may be configured to enable the common terminal connecting to the first terminal when being in a first operational state, connecting to the second terminal when being in a second operational state, and connecting to the third terminal when being in a third operational state. When in the third operational state, the contactor weld detection circuit of FIG. 8 may be similar to that of FIG. 2.

In an example, the switching device K40 may be a tri-state switch. In another example, the switching device K40 may comprise three separate switches, one ends of which may be connected together as the common terminal, the three other ends of the three separate switches may be used as the first, second and third terminals respectively. Examples of the switching device K40 may include but not be limited to, such as relays, triode transistors, Complementary Metal-Oxide-Semiconductor Transistors (CMOS), Insulated Gate Bipolar Translators (IGBT) etc.

In an alternative embodiment, the switching device K40 may comprise a first terminal, a second terminal, and a common terminal. The common terminal may be connected with the negative terminal of the power source (e.g., the voltage source DC in FIG. 8). The first terminal of the switching device may be connected with the end (i.e., the third end) of the second contactor K3, which may be connected with the negative electrode terminal of the battery pack side 110. The second terminal of the switching device K40 may be connected with the end (i.e., the first end) of the first contactor K2, which may be connected with the positive electrode terminal of the battery pack side 110. The switching device K40 may be configured to enable the common terminal connecting to the first terminal when being in a first operational state, and connecting to the second terminal when being in a second operational state. In this embodiment, no terminal of the switch device K40 may be connected with the ground, e.g., the chassis.

Figure 9:
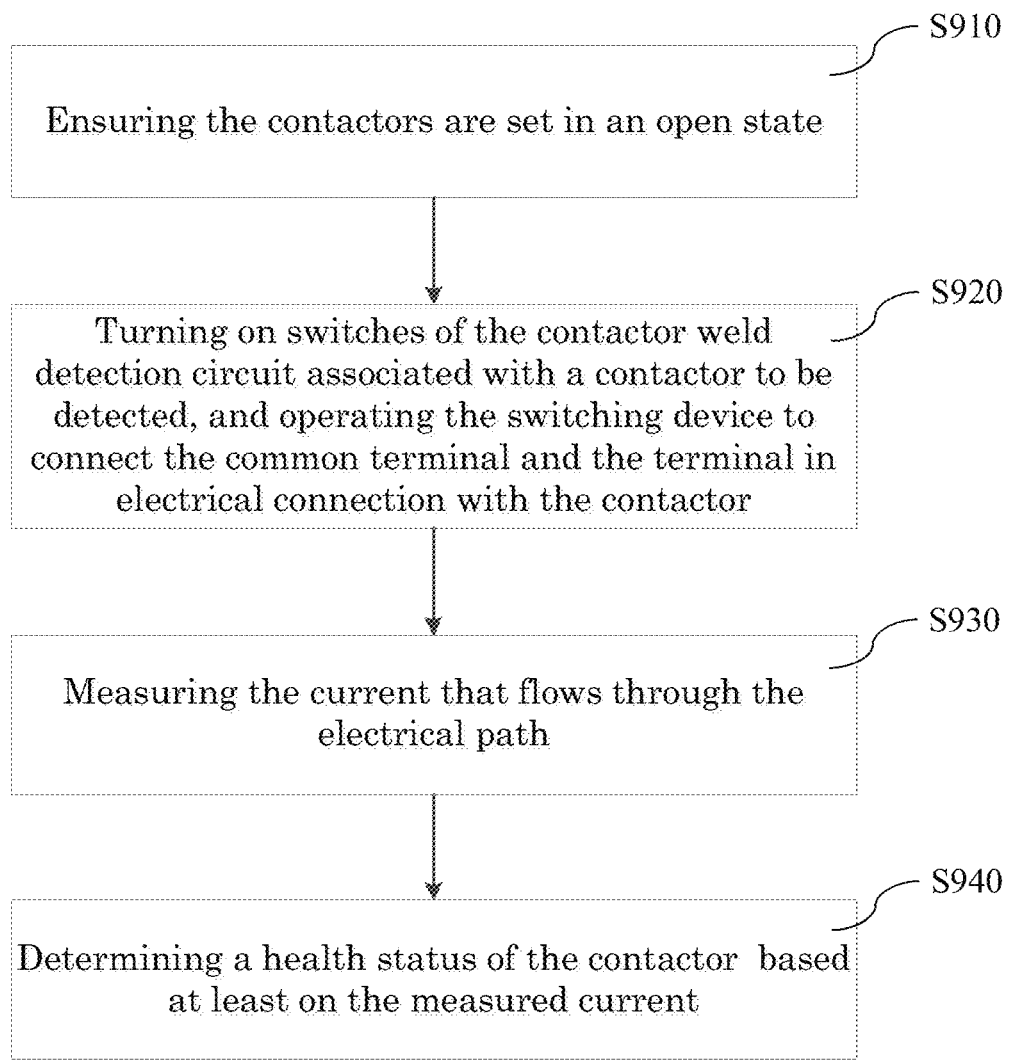
FIG. 9 is a flow chart illustrating a yet another example method for contactor weld detection according to a yet another example embodiment of the disclosure.

FIG. 9 is a flow chart illustrating a yet another example method for contactor weld detection according to a yet another example embodiment of the disclosure. The method may be used in vehicles, such as electric vehicles, hybrid-electric vehicles, for example. Referring to FIG. 9, the method may comprise following steps.

At S910, contactors may be set in an open state. Specifically, the contactors (i.e., the first and second contactors K2, K3) may be ensured that the contactors may be set in an open state before the operation of contactor weld detection. At S920, switches of the contactor weld detection circuit associated with a contactor to be detected (i.e., one of the first and second contactors) may be turned on (i.e., switched on) and the switching device K40 may be operated to connect the common terminal to one of the first, second and third terminals (alternatively, the first and second terminals in the above alternative embodiment) in electrical connection with the contactor to be detected. For example, in case of the second contactor K3 being detected, switch K21 may be turned on (and switch K22 may be turned on, if any), and the switching device K40 may be operated to be switched to the first operational state, in which the common terminal may be electrically connected with the first terminal, in order to make a circuit (electrical path) around the second contactor K3 (e.g., as indicated by a circular arrow in FIG. 8). At S930, the current that flows through the electrical path (equivalent to the current passing through the power source (e.g., voltage source) may be measured. There may be various ways to measure the current. In an example, a current sensor may be used to measure the current, such as, e.g., Hall sensor. In another example, a voltage sensor may be used to measure a voltage across a resistor of which the resistance may be known (e.g., R22 in FIG. 8). By dividing the measured voltage by the resistance, the current may be measured. At S940, a health status of the contactor may be determined based at least on the measured current. Specifically, it may be determined that whether contactor weld may happen, and if happen the weld may be a partial weld (i.e., the contactor may be partially welded) or a complete weld (i.e., the contactor may be completely welded), based on the measured current. By dividing the voltage of the power source (which may be known) by the current, it may be possible to measure the total current and therefore, the resistance of the contactor. The type of weld (i.e., the partial weld or the complete weld) may be detected based on the resistance of the contactor, since the resistance of the contactor while the contactor may be partially welded may distinguishable from that while being completely welded.

In addition, if the other contactor (e.g., the first contactor K2) may need to be detected, the switch associated with the contactor (e.g., switch K20) may be turned on, and the switching device K40 may be operated to be switched to the second operational state, in which the common terminal may be switched to connect the second terminal, from disconnecting from the first terminal.

Extra cost for this method of the embodiment with reference to FIGS. 8 and 9 may be a tri-state switch or three high-voltage switches, but the benefit may be being isolated from the chassis and any single point fault that might happen between high-voltage and the chassis. As shown in FIG. 8, for diagnosing a contactor, the common point of the isolation monitoring may be connected to one side of the contactor, and the same polarity of the switch for isolation monitoring would be turned on. The circuit would be formed around the high-current contactor, therefore the measured resistance would include the series resistance of the isolation monitoring as well as the contactor resistance.

Figure 10:
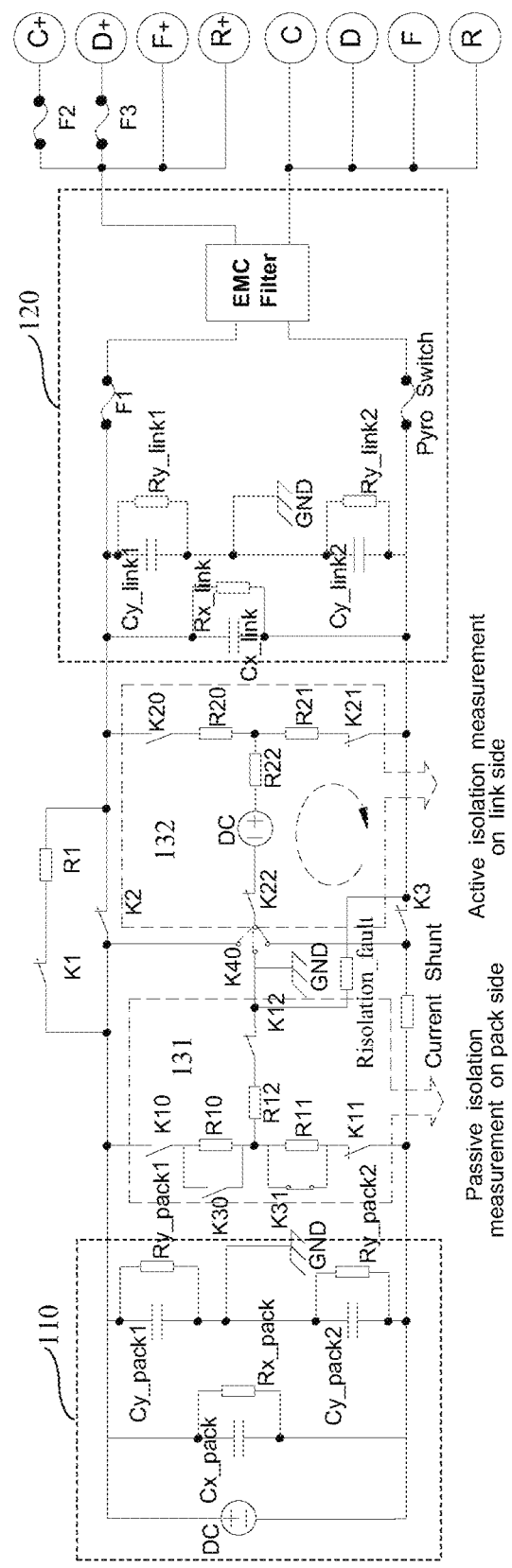
FIG. 10 shows an exemplar use of the method for contactor weld detection with reference to FIG. 9 in case there may be any isolation fault in the battery pack.

FIG. 10 shows an exemplar use of the method for contactor weld detection with reference to FIG. 9 in case there may be any isolation fault in the battery pack. The fault resistance would be between high voltage points and chassis (e.g., Riso_fault in FIG. 10); therefore, no circuit would be formed around the contactor weld detection circuitry.

Figure 11:
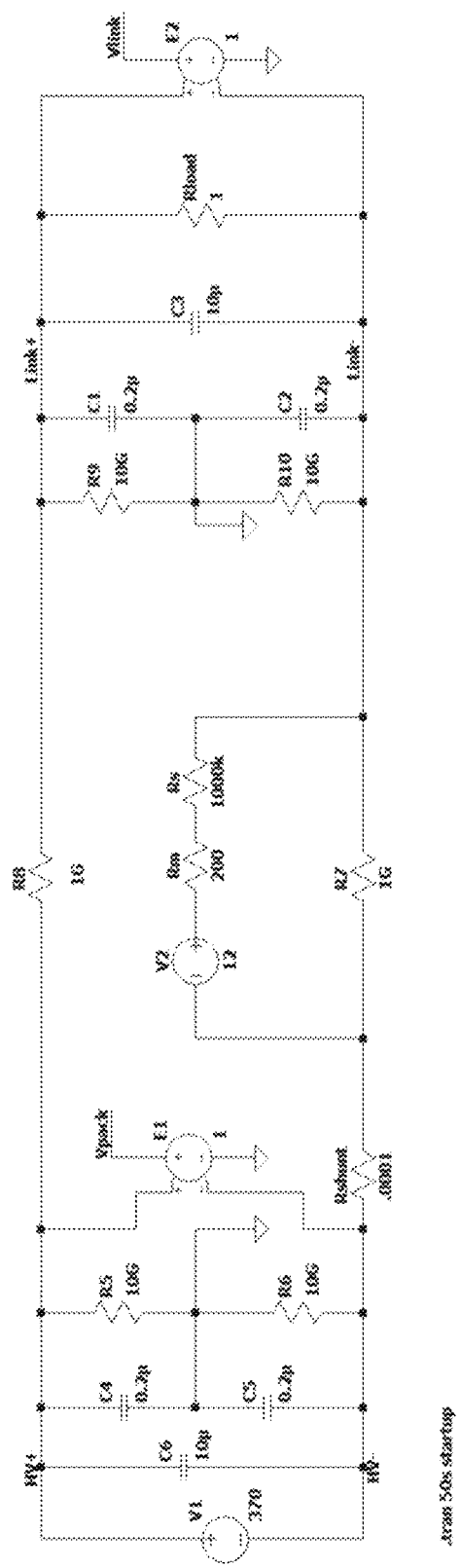
FIG. 11 demonstrates a case in which a low-side contactor is being diagnosed.
Figure 12:
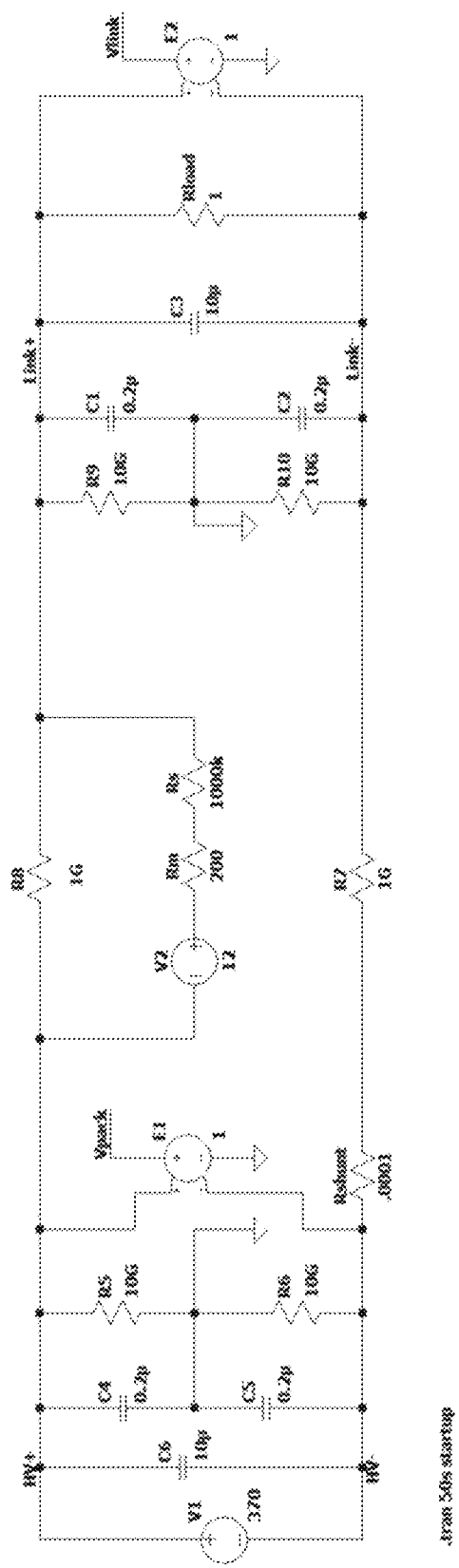
FIG. 12 demonstrates another case where a high-side contactor is being diagnosed.

In order to proof the idea of the architecture of FIG. 8, a simulation has been done in different fault scenarios. FIG. 11 demonstrates a case in which a low-side contactor is being diagnosed and FIG. 12 demonstrates a case where a high-side contactor is being diagnosed.

Simulation result for both diagnosis cases have been gathered in FIG. 13. Contactor weld detection mechanism is performed when both contactors are set as open. As it can be seen, when both contactors are open, the current passing through the power source (active source) would be 0 A (as shown in first two rows of the table in FIG. 13). If any of the contactors are welded, the result would be different and nominal current (voltage of the source divided by series resistance) would be measured from the active source (row 3 to 6). In case there is double welding, the result would be like rows 7 and 8. Since all these cases are distinguishable from each other, that means we can make a look up table for each test case and compare the result with the look-up table. Therefore, we can detect the type of failure in the contactors based on that look-up table.

Figure 14:
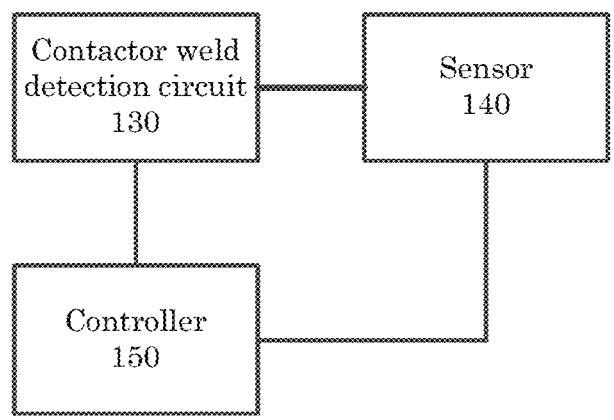
FIG. 14 is a schematic block diagram illustrating an example apparatus for contactor weld detection in which the methods for contactor weld detection may be implemented, according to an example embodiment of the disclosure.

In an example embodiment of the disclosure, an apparatus for contactor weld detection may be provided. FIG. 14 is a schematic block diagram illustrating an example apparatus for contactor weld detection in which the methods for contactor weld detection may be implemented, according to an example embodiment of the disclosure. The apparatus may be used to implement the methods for contactor weld detection as described in the above embodiments. Referring to FIG. 14, the apparatus may comprise the contactor weld detection circuit 130 (e.g., as described in above embodiments), a sensor 140 configured to measure a current passing through the power supply of the contactor weld detection circuit, and a controller 150 configured to determine a health status of the contactor to be detected, based at least on the measured current.

Specifically, in example embodiments, switches of the contactor weld detection circuit 130 may be controllable switches, examples of which may include, but not be limited to, relays, triode transistors, Complementary Metal-Oxide-Semiconductor Transistors (CMOS), Insulated Gate Bipolar Translators (IGBT) etc., for example. Examples of the controller may include, but not be limited to, a DSP core, a microcontroller, Application Specific Integrated Circuits (ASICs), Field Programmable Gate Arrays (FPGAs) circuits, any other type of integrated circuit (IC), a state machine, and the like. In an example embodiment, the controller 150 may include a memory (not shown) configured to store data, instructions, applications that can be executed by the controller 150 when being invoked therefrom. In an example, the look-up table aforesaid can be stored in the memory for use by the controller when comparing the result with the look-up table. Examples of the sensor 140 may include, but not be limited to, a Hall current sensor, a Hall voltage sensor, etc., for example.

Experimental Result

In order to show the feasibility of the methods for contactor weld detection, an experimental setup was designed. This setup can be reconfigured to show each proposed method in above embodiments.

In order to emulate Isolation measurement unit, a power supply with variable voltage and internal resistance of 100 ohm has been used. Current and voltage probes are connected to the power supply and the result is shown in oscilloscope. In the experimental setup, high value resistors have been eliminated in order to increase the current and having better result in the oscilloscope plot.

Figure 15:
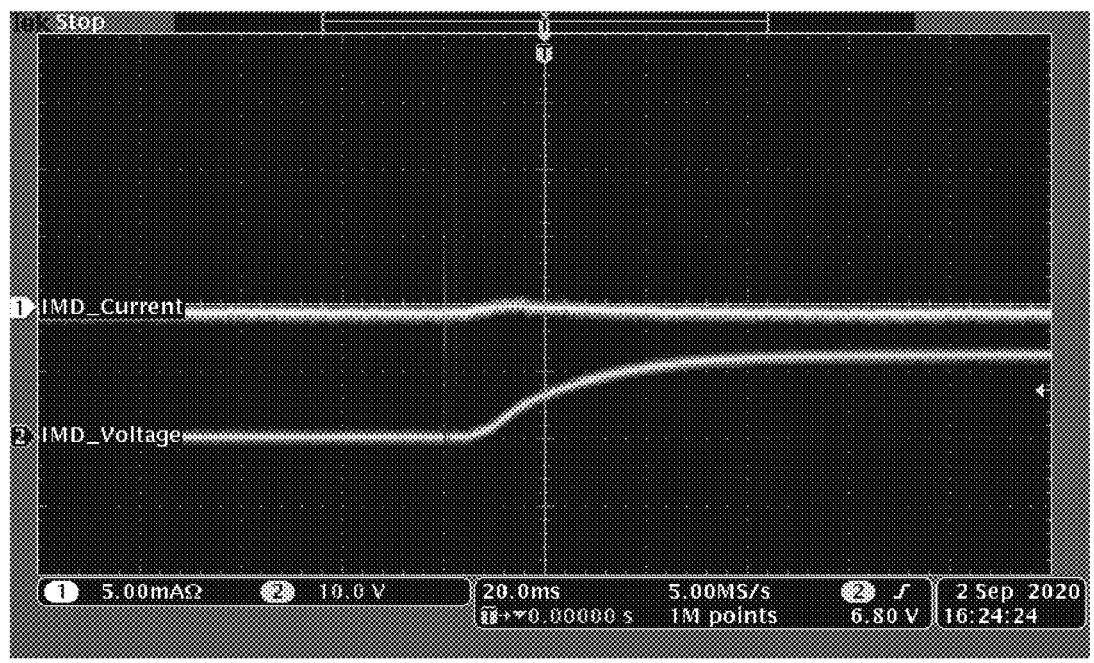
FIG. 15 demonstrates the result power supply current and voltage for the method of FIG. 3 in case there is no fault at all.

FIG. 15 demonstrates the result power supply current and voltage for the method of FIG. 3 in case there is no fault at all. In this case, the moment that power supply applies a step voltage, current does not change, and its final value is OA.

Figure 16:
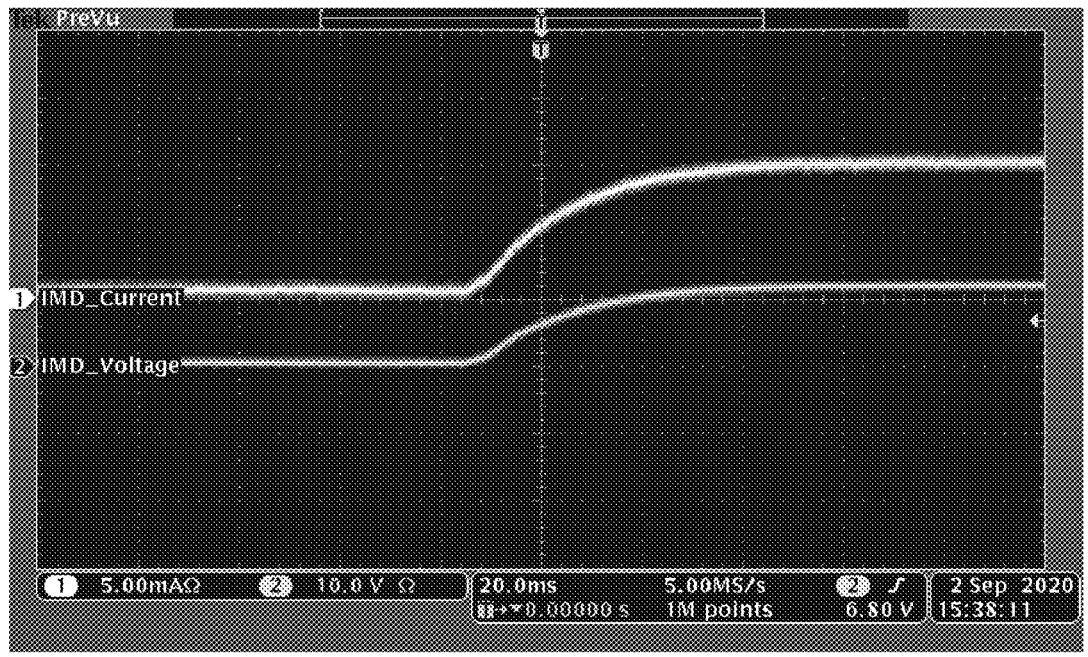
FIG. 16 demonstrates the result power supply current and voltage for the method of FIG. 3 for a case where circuit based on FIG. 2 has a welded negative contactor.

FIG. 16 demonstrates the result power supply current and voltage for the method of FIG. 3 for a case where circuit based on FIG. 2 has a welded negative contactor. In this case, current of the power supply will rise as soon as power supply voltage increase.

Figure 17:
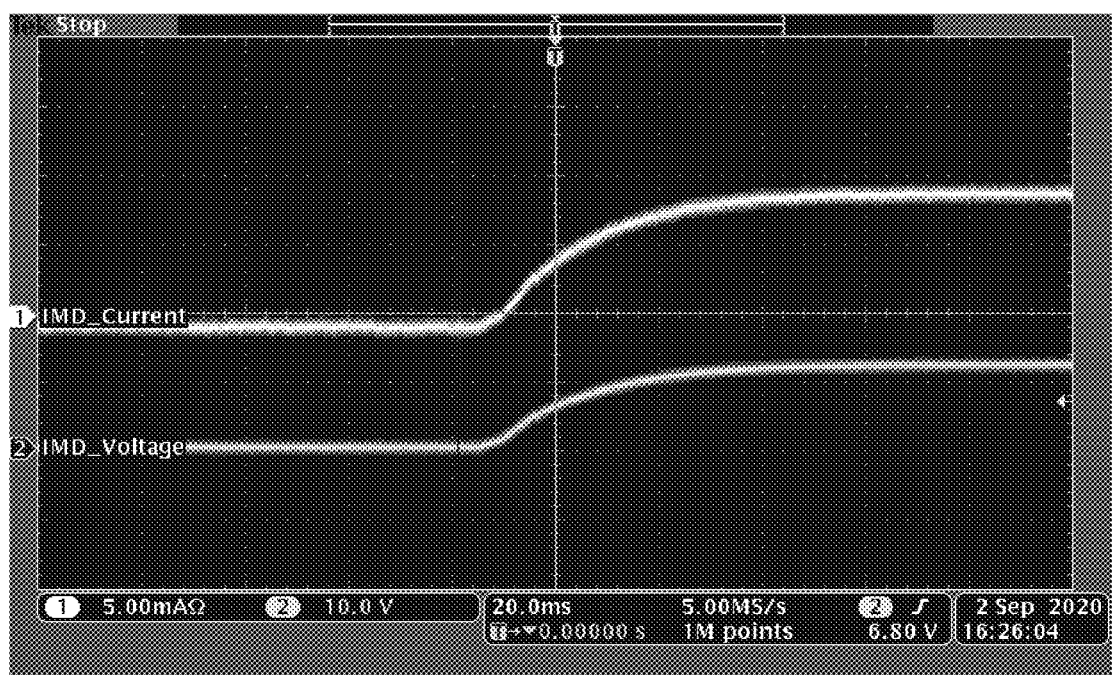
FIG. 17 shows the result power supply current and voltage for circuit based on FIG. 4.

FIG. 17 shows the result power supply current and voltage for circuit based on FIG. 4. In this circuit, there is an isolation resistance failure between link negative and common ground point but there is no contactor failure. The current of the power supply will rise as well because there is a conduction path around the negative contactor. This means that the circuits of FIGS. 2 and 5 are not immune to isolation resistance failure and can't distinguish between contactor failure or isolation resistance failure (although the method of FIG. 6 has better resiliency, due to its lower internal resistance).

Figure 18:
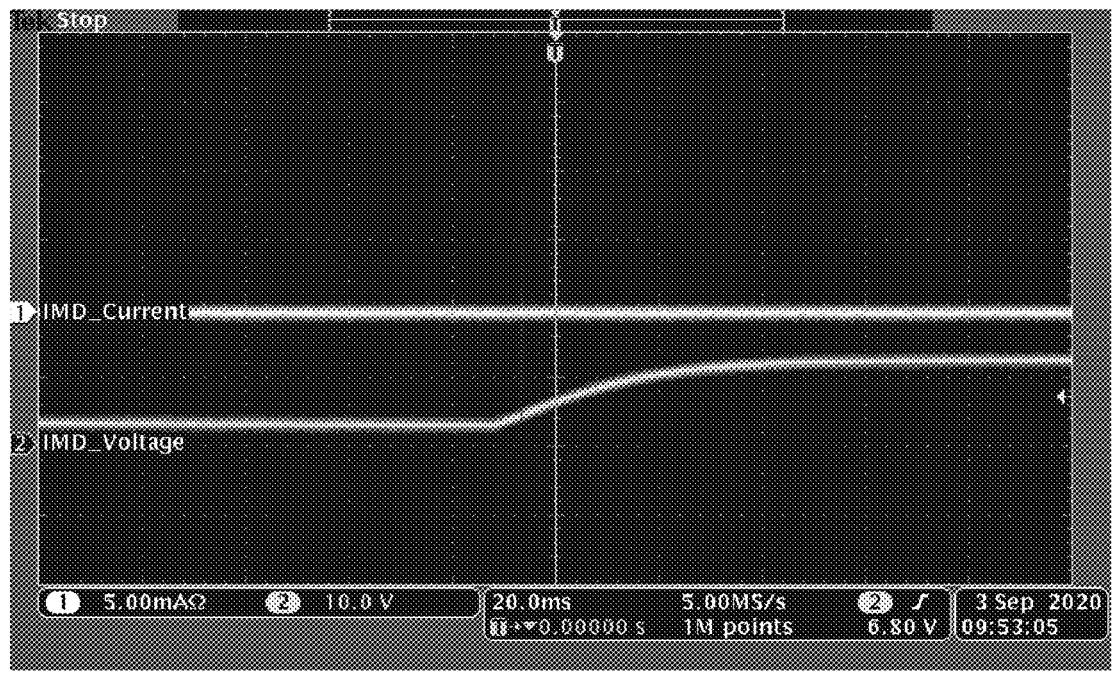
FIG. 18 shows the result of the test for the method of FIG. 9 in case there is no failure.

The method of FIG. 9 has been designed to improve the sensibility of the weld detection circuit to the isolation resistance failure. FIG. 18 shows the result of the test for such system in case there is no failure. Just like the other methods, no current conduction means there is no failure in the contactors.

Figure 19:
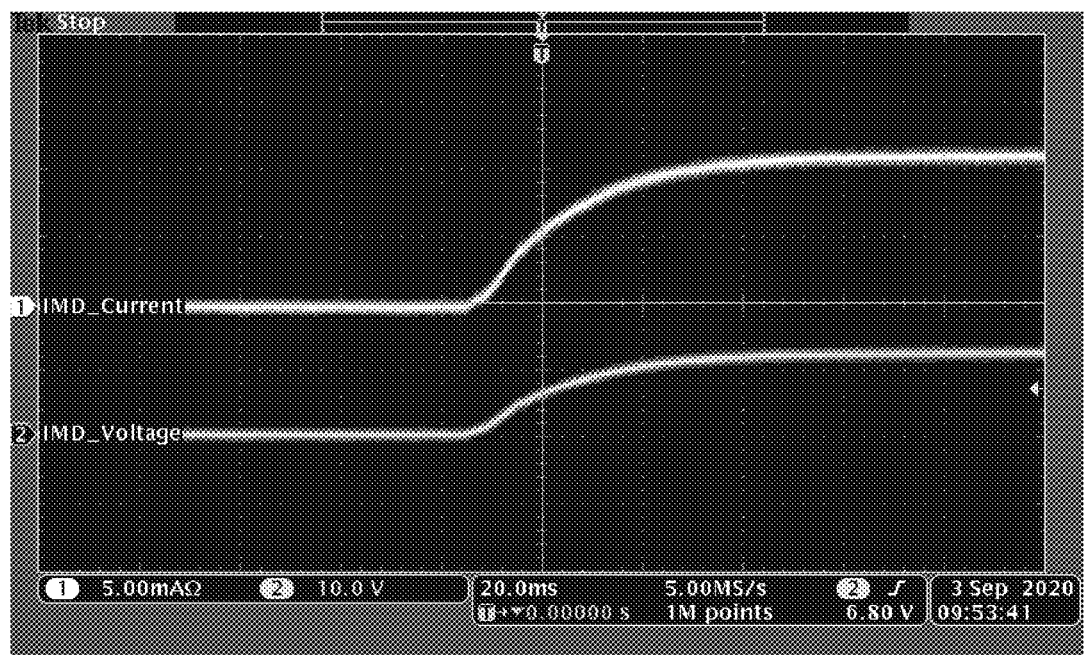
FIG. 19 shows the capability of the method for detecting contactor weld failure of FIG. 9.

FIG. 19 shows the capability of the method for detecting contactor weld failure of FIG. 9. Power supply applies a step voltage over the contactor and due to its failure; a conducted current is detectable by the system controller.

Figure 20:
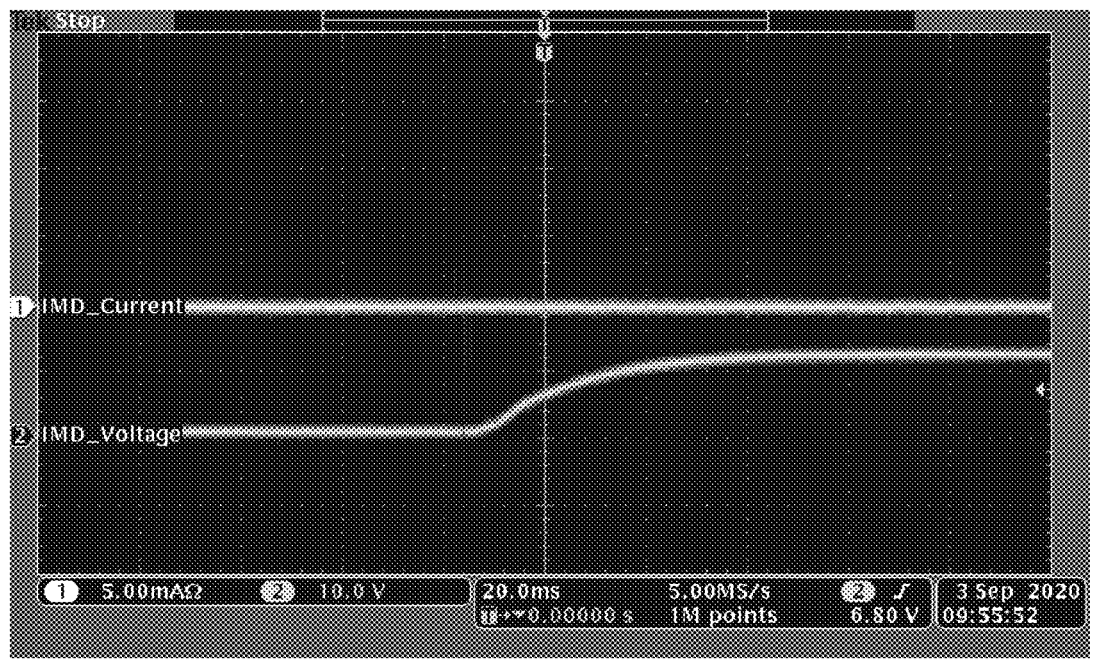
FIG. 20 and FIG. 21 are representatives of a system that has no contactor weld but has isolation failure in the link side or battery pack side.
Figure 21:
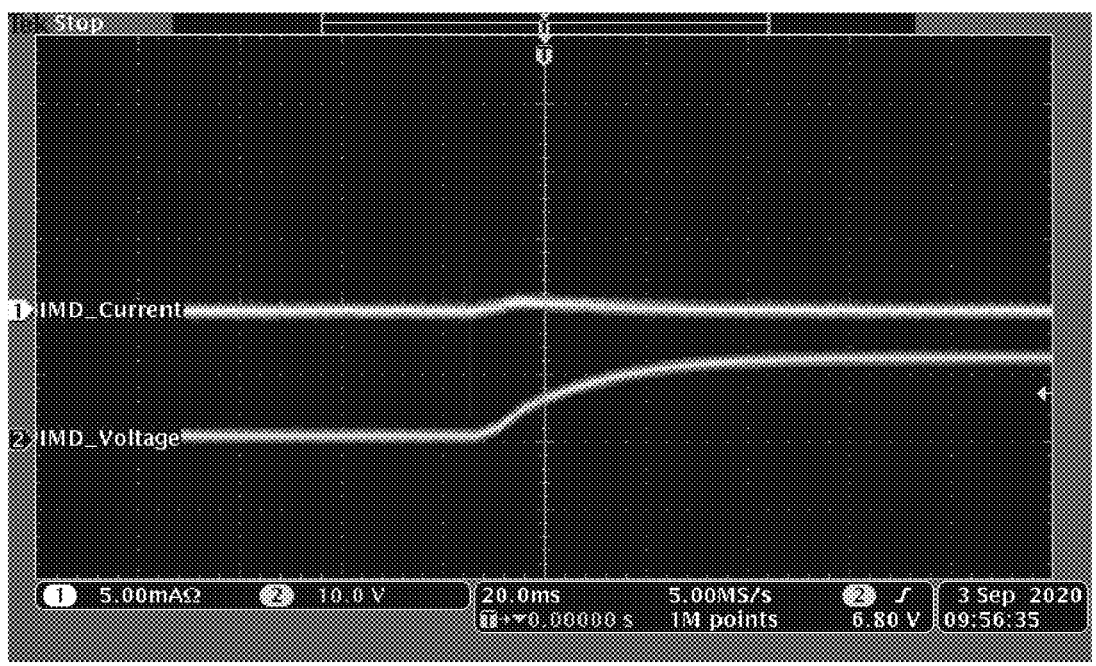

FIG. 20 and FIG. 21 are representatives of a system that has no contactor weld but has isolation failure in the link or battery pack side. As it has shown, no current is passing through the power supply at this case and it shows the immunity of the method of FIG. 9 to the isolation resistance failure when detecting weld in the contactors.

Vehicles in which embodiments of the disclosure may be implemented may include electric or hybrid-electric vehicles, examples of which may include but not be limited to, for example, cars, trucks, buses, marine vessels, work vehicles such as wheel loaders, excavators, dumpers, compacting machine or forest machine, off-road vehicles, or the like.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes can include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular application.

The invention claimed is:

1. A method for contactor weld detection in a vehicle, wherein the vehicle comprises a battery system, the battery system comprises a battery pack side, a link side, a first contactor and a second contactor, the first contactor is configured to connect a positive electrode terminal of the battery pack side and a positive terminal of the link side, the second contactor is configured to connect a negative electrode terminal of the battery pack side and a negative terminal of the link side, wherein, the battery system further comprises a contactor weld detection circuit including a first circuit and a second circuit,
the first circuit comprises a first leg including a first switch and a first resistor in series connection with each other and a second leg including a second switch and a second resistor in series connection with each other, one end of the first leg is connected with the positive electrode terminal of the battery pack side, one end of the second leg is connected with the negative electrode terminal of the battery pack side, the other ends of the first and second legs are connected together and to a chassis of the vehicle,
the second circuit comprises a third leg including a third switch and a third resistor in series connection with each other, a fourth leg including a fourth switch and a fourth resistor in series connection with each other, and a power source, one end of the third leg is connected with the positive terminal of the link side, one end of the fourth leg is connected with the negative terminal of the link side, the other ends of the third and fourth legs are connected together and to a positive terminal of the power source, a negative terminal of the power source is operably connected with the chassis,
wherein, the method comprising:
ensuring the first and second contactors are set in an open state;
operating the contactor weld detection circuit to enable an electrical path around a contactor of the first and second contactors to be detected;
measuring a current that flows through the electrical path; and
determining a health status of the contactor based at least on the measured current.

2. The method of claim 1, wherein the step of operating the contactor weld detection circuit to enable an electrical path around a contactor of the first and second contactors to be detected comprising:
turning on one of the first and second switches and one of the third and fourth switches associated with the contactor to be detected, in order to enable the electrical path around the contactor.

3. The method of claim 1, wherein the step of determining a health status of the contactor based at least on the measured current comprising:
determining whether the contactor is welded based at least on the measured current.

4. The method of claim 3, wherein the step of determining a health status of the contactor based at least on the measured current further comprising:
determining a resistance of the contactor based at least on the measured current, on a condition that the contactor is determined to be welded; and
determining a type of the contactor weld based on the determined resistance.

5. The method of claim 4, wherein the type of the contactor weld comprises a partial weld or a complete weld.

6. The method of claim 1, wherein the first circuit further comprises:
a first bypass switch in parallel connection with the first resistor; and
a second bypass switch in parallel connection with the second resistor;
wherein the method further comprising:
turning on one of the first and second bypass switches in order to bypass one of the first and second resistors in the electrical path.

7. The method of claim 1, wherein the contactor weld detection circuit further comprises:
a switching device including a common terminal, a first terminal, a second terminal and a third terminal,
wherein, the common terminal is electrically connected with the negative terminal of the power source, the first terminal is electrically connected with one end of the second contactor electrically connected with the negative electrode terminal of the battery pack side, the second terminal is electrically connected with one end of the first contactor electrically connected with the positive electrode terminal of the battery pack side, and the third terminal is electrically connected with the chassis, the switching device is configured to electrically connect the common terminal and the first terminal when in a first operational state, electrically connect the common terminal and the second terminal when in a second operational state, and electrically connect the common terminal and the third terminal when in a third operational state, wherein, the step of operating the contactor weld detection circuit to enable an electrical path around a contactor of the first and second contactors to be detected comprising:

turning on one of the third and fourth switches associated with the contactor to be detected, and operating the switching device to electrically connect the common terminal and one of the first, second and third terminals in electrical connection with the contactor, in order to enable the electrical path around the contactor.

8. The method of claim 7, wherein the step of determining a health status of the contactor based at least on the measured current comprising:

comparing the measured current with a look-up table;
determining a type of failure in the contactors based on the comparison result.

9. The method of claim 7, wherein the switching device comprises a tri-state switch.

10. An apparatus for contactor weld detection in a vehicle, wherein the vehicle comprises a battery system, the battery system comprises a battery pack side, a link side, a first contactor and a second contactor, the first contactor is configured to connect a positive electrode terminal of the battery pack side and a positive terminal of the link side, the second contactor is configured to connect a negative electrode terminal of the battery pack side and a negative terminal of the link side, wherein, the apparatus comprising:

a contactor weld detection circuit including a first circuit and a second circuit, wherein the first circuit comprises a first leg including a first switch and a first resistor in series connection with each other and a second leg including a second switch and a second resistor in series connection with each other, one end of the first leg is connected with the positive electrode terminal of the battery pack side, one end of the second leg is connected with the negative electrode terminal of the battery pack side, the other ends of the first and second legs are connected together and to a chassis of the vehicle, the second circuit comprises a third leg including a third switch and a third resistor in series connection with each other, a fourth leg including a fourth switch and a fourth resistor in series connection with each other, and a power source, one end of the third leg is connected with the positive terminal of the link side, one end of the fourth leg is connected with the negative terminal of the link side, the other ends of the third and fourth legs are connected together and to a positive terminal of the power source, a negative terminal of the power source is operably connected with the chassis;

a sensor configured to measure a current that flows through the power source; and a controller configured to:
ensure the first and second contactors are set in an open state;

operating the contactor weld detection circuit to enable an electrical path around a contactor of the first and second contactors to be detected;

receive, from the sensor, the measured current that flows through the electrical path; and determine a health status of the contactor based at least on the measured current.

11. The apparatus of claim 10, wherein the controller is configured to:

turn on one of the first and second switches and one of the third and fourth switches associated with the contactor to be detected, in order to enable the electrical path around the contactor.

12. The apparatus of claim 10, wherein the controller is configured to:

determine whether the contactor is welded based at least on the measured current.

13. The apparatus of claim 12, wherein the controller is further configured to:

determine a resistance of the contactor based at least on the measured current, on a condition that the contactor is determined to be welded; and determine a type of the contactor weld based on the determined resistance.

14. The apparatus of claim 13, wherein the type of the contactor weld comprises a partial weld or a complete weld.

15. The apparatus of claim 10, wherein the first circuit further comprises:

a first bypass switch in parallel connection with the first resistor; and a second bypass switch in parallel connection with the second resistor;

wherein the controller is further configured to:

turn on one of the first and second bypass switches in order to bypass one of the first and second resistors in the electrical path.

16. The apparatus of claim 10, wherein the contactor weld detection circuit further comprises:

a switching device including a common terminal, a first terminal, a second terminal and a third terminal, wherein, the common terminal is electrically connected with the negative terminal of the power source, the first terminal is electrically connected with one end of the second contactor electrically connected with the negative electrode terminal of the battery pack side, the second terminal is electrically connected with one end of the first contactor electrically connected with the positive electrode terminal of the battery pack side, and the third terminal is electrically connected with the chassis, the switching device is configured to electrically connect the common terminal and the first terminal when in a first operational state, electrically connect the common terminal and the second terminal when in a second operational state, and electrically connect the common terminal and the third terminal when in a third operational state, wherein, the controller is configured to:

turn on one of the third and fourth switches associated with the contactor to be detected, and operate the switching device to electrically connect the common terminal and one of the first, second and third terminals in electrical connection with the contactor, in order to enable the electrical path around the contactor.

17. The apparatus of claim 16, wherein the controller is configured to:
  comparing the measured current with a look-up table;
  determining a type of failure in the contactors based on the comparison result.

18. The apparatus of claim 16, wherein the switching device comprises a tri-state switch.

19. A vehicle, comprising:
  a battery pack side;
  a link side;
  a first contactor and a second contactor, wherein the first contactor is configured to connect a positive electrode terminal of the battery pack side and a positive terminal of the link side, the second contactor is configured to connect a negative electrode terminal of the battery pack side and a negative terminal of the link side; and
  the apparatus of claim 10.

* * * * *